United States Patent
Eichmeyer et al.

(10) Patent No.: US 11,468,965 B2
(45) Date of Patent: Oct. 11, 2022

(54) APPARATUS AND TECHNIQUES FOR PROGRAMMING ANTI-FUSES TO REPAIR A MEMORY DEVICE

(71) Applicant: Micron Technology, Inc., Boise, ID (US)

(72) Inventors: Seth A. Eichmeyer, Boise, ID (US); Patrick Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 455 days.

(21) Appl. No.: 16/599,796

(22) Filed: Oct. 11, 2019

(65) Prior Publication Data
US 2021/0110881 A1    Apr. 15, 2021

(51) Int. Cl.
*G11C 29/00* (2006.01)
*G06F 11/20* (2006.01)

(52) U.S. Cl.
CPC ........ *G11C 29/787* (2013.01); *G06F 11/2094* (2013.01); *G11C 29/765* (2013.01); *G11C 29/808* (2013.01); *G11C 29/883* (2013.01)

(58) Field of Classification Search
None
See application file for complete search history.

(56) References Cited

U.S. PATENT DOCUMENTS

| | | | | |
|---|---|---|---|---|
| 2010/0157704 A1* | 6/2010 | Iwaki | .................... | G11C 17/165 365/194 |
| 2014/0078842 A1* | 3/2014 | Oh | ........................ | G11C 29/785 365/200 |
| 2017/0110206 A1* | 4/2017 | Ryu | .................... | G11C 29/4401 |
| 2019/0156909 A1* | 5/2019 | Lee | ........................ | G11C 29/76 |
| 2019/0392911 A1* | 12/2019 | Jo | ............................ | G11C 7/08 |

* cited by examiner

*Primary Examiner* — Guerrier Merant
(74) *Attorney, Agent, or Firm* — Holland & Hart LLP (57) ABSTRACT

Methods, systems, and devices for programming anti-fuses are described. An apparatus may include a repair array including elements for replacing faulty elements in a memory array and may further include an array of anti-fuses for indicating which, if any, elements of the memory array are being replaced by elements within the repair array. The array of anti-fuses may indicate an address of an element of the memory array being replaced by an element within the repair array. The array of anti-fuses may indicate an enablement or disablement of the element within the repair array indicating whether the element within the repair array is enabled to replace the element of the memory array. The array of anti-fuses may include anti-fuses with lower reliability and anti-fuses with higher reliability. An anti-fuse associated with the enabling of the element within the repair array may include an anti-fuse having the higher reliability.

17 Claims, 6 Drawing Sheets

Lower Reliability Anti-fuse

Higher Reliability Anti-fuse

FIG. 3

Lower Reliability Anti-fuse

Higher Reliability Anti-fuse

APPARATUS AND TECHNIQUES FOR PROGRAMMING ANTI-FUSES TO REPAIR A MEMORY DEVICE

BACKGROUND

The following relates generally to a system that includes at least one memory device and more specifically to apparatus and techniques for programming anti-fuses to repair a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Some memory device may include a repair array with elements to replace faulty elements within a memory array (e.g., a primary array) of the memory device. For example, a portion of the memory array associated with an address may be faulty and the memory array may be programmed to store data associated with that address within the repair array instead.

DETAILED DESCRIPTION

A memory device may include a memory array to store data at the memory device. The memory array may include a set of elements each accessible (e.g., by an access command such as a write command, a read command, a refresh command) by an address. For example, an element may include a single memory cell. In another example, an element may include a row or column of memory cells within the memory array, a column of memory cells within the memory array, or a sub-array of memory cells within the memory array. When the memory device receives an access command, the access command may include an address corresponding to an element of the memory array.

In some instances, one or more elements within a memory array may be faulty. The memory device may be operable to "replace" a faulty element of a memory array with an element of a repair array. To improve the yield of memory devices, the memory device may include a repair array (sometimes referred to as a redundancy array). After manufacturing, one or more elements of the memory array may be unusable. Rather than throwing out the entire memory array, the addresses for the faulty elements can be redirected to addresses of elements in the repair array. In this manner, when an address comes in from a host system, the memory device may compare that address to a list of one or more addresses of the main array that are redirected to the repair array. If the received address is one of the redirected address, the memory device may access the element of the repair array rather than the faulty element of the memory array.

The memory device may include an array of anti-fuses configured to store an indication of addresses within the memory device that are faulty elements. Thus, when the memory device receives an access command, the memory device may refer to the array of anti-fuses to determine if the address included in the access command corresponds to a faulty element within the memory array and then identify an element within the repair array that replaces the faulty element.

The array of anti-fuses may include multiple blocks of anti-fuses. Each block of anti-fuses may be associated with an element of the repair array. Each block of anti-fuses may indicate an address of the memory array being replaced or may indicate whether this element is actively replacing an element of the memory array or both. Each block of anti-fuses may include a first set of anti-fuses for indicating the address and a second set of anti-fuses for indicating whether the element of the repair array is enabled or disabled. For example, if an address is eight bits, each block within the array of anti-fuses may include a set of eight anti-fuses for indicating each bit of an address. The second set of anti-fuses (which may include one or more anti-fuses) may indicate an enablement or disablement of the associated element of the repair array. That is, if the block is storing a valid address of the memory array that is being replaced by the respective element of the repair array, the block may include one or more anti-fuses indicating that the element of the repair array is enabled to replace the indicated address. Conversely, the block may include one or more anti-fuses indicating that the element of the repair array is disabled.

An anti-fuse may be an example of device that begins with a high resistance and creates an electrically conductive path of a lower resistance after the application of a voltage satisfies a threshold. The conductive path created by anti-fuses may not be reliable. For example, there may be a small likelihood that when a voltage is applied to the anti-fuse that a conductive path is not formed and the anti-fuse remains at some higher resistance. To increase a reliability of an anti-fuse, the configuration of an anti-fuse may be altered. For example, two or more anti-fuses may be coupled in a parallel configuration and coupled with an OR gate. In this configuration, if any of the anti-fuses are activated, then the circuit will create a conductive path. Such a configuration may have a higher reliability than a single anti-fuse. When increasing a numerical quantity of anti-fuses (e.g., to increase reliability), there may also be an increase in footprint size of the anti-fuses. In order to both maintain a desired reliability of some anti-fuses and maintain a small footprint; the array of anti-fuses may include one or more anti-fuses that are in a lower reliability configuration for some functions while including one or more anti-fuses that are in a higher reliability configuration for more critical functions. For example, anti-fuses used to store address information within a block may be in lower reliability configuration. Additionally or alternatively, anti-fuses used to store enablement or disablement information for a block may be in a higher reliability configuration. The enablement or disablement information may be more critical as any block with faulty anti-fuses storing address information may be disabled. If an anti-fuse for enabling or disabling a block within the array of anti-fuses is faulty, the entire array of anti-fuses, the repair array, or the memory array may perform unpredictably.

Features of the disclosure are initially described in the context of a memory system as described with reference to FIG. 1. Features of the disclosure are further described in the context of an anti-fuse configuration, arrays of anti-fuses, and a process flow as described with reference to FIGS. 2-4. These and other features of the disclosure are further illustrated by and described with reference to an apparatus diagram and a flowchart that relate to apparatus and techniques for programming anti-fuses to repair a memory device as described with references to FIGS. 5-6.

Figure 1:
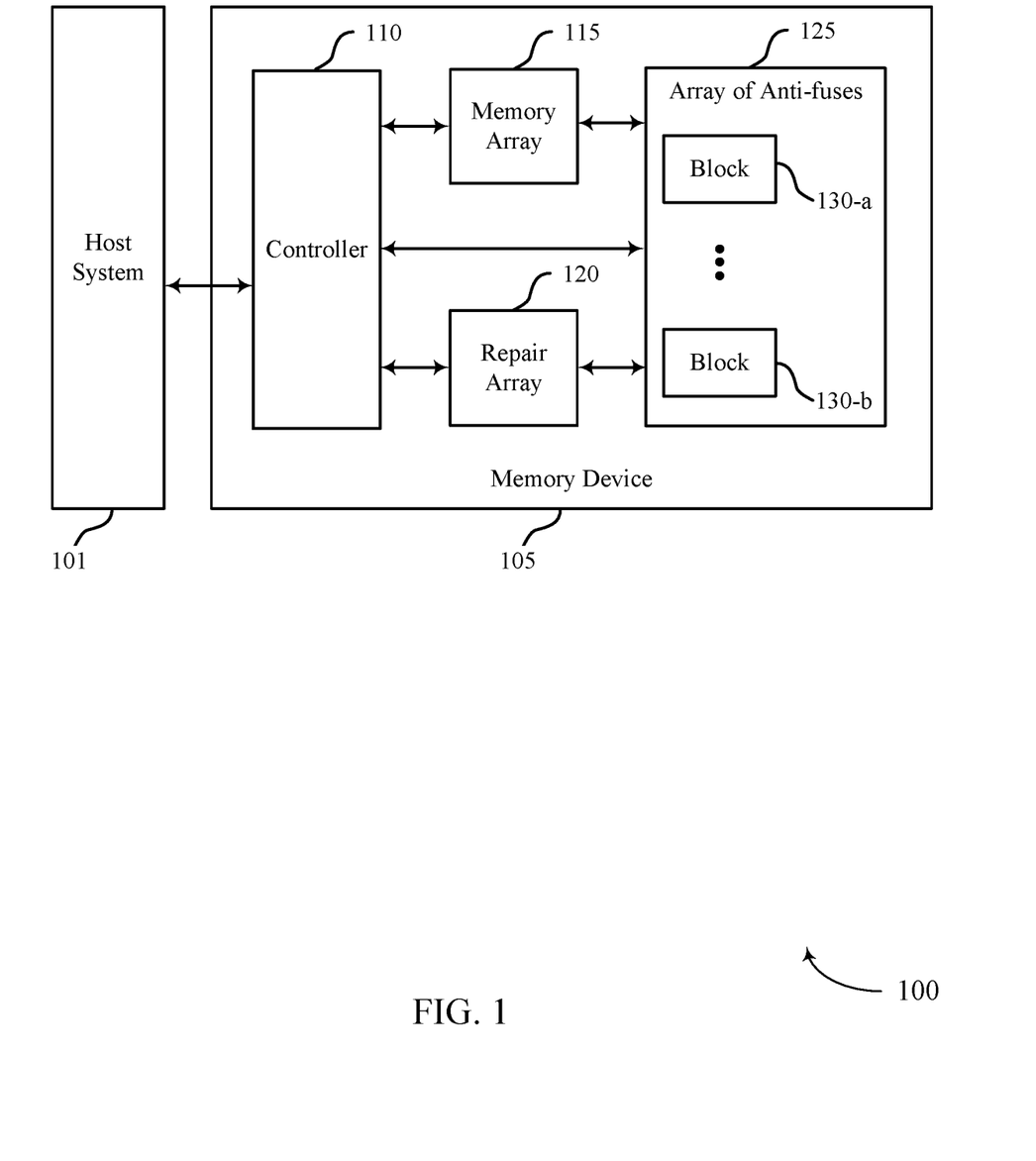
FIG. 1 illustrates an example of a system that supports apparatus and techniques for programming anti-fuses to repair a memory device in accordance with examples as disclosed herein.

FIG. 1 illustrates a system 100 that supports apparatuses and techniques for programming anti-fuses to repair a memory device in accordance with examples as disclosed herein. The system 100 may include a host system 101 and a memory device 105. The memory device 105 may include a controller 110, a memory array 115, and components for repairing the memory array 115. For example, the memory device 105 may include a repair array 120 and an array of anti-fuses 125.

The system 100 may include the host system 101. The host system 101 may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host system may refer to the hardware, firmware, software, or a combination thereof that implements the functions of an external memory controller. In some cases, the host system 101 may be referred to as a host or host device. The memory device 105 may be configured to store data for the system 100 (e.g., within the memory array 115). In some cases, the memory device 105 may act as a slave-type device to the host system 101 (e.g., responding to and executing commands provided by the host system 101). Such commands may include an access command for an access operation, such as a write command for a write operation, a read command for a read operation, a refresh command for a refresh operation, or other commands.

The memory device 105 may include a memory array 115 with memory cells that are programmable to store different logic states. In some cases, a memory cell within the memory array 115 may be programmable to store two logic states, which may be denoted as a logic 0 and a logic 1. In some cases, a memory cell within the memory array 115 may be programmable to store more than two logic states. In the example of memory device 105, different logic states may be programmed by writing memory cells having configurable material characteristics or material properties that correspond to different logic states, where such material characteristics or material properties (e.g., material states) may be detected during a subsequent read operation to identify a stored logic state. The memory array 115 may include a set of memory sections or elements, which may refer to a contiguous tile of memory cells (e.g., a contiguous set of elements of a semiconductor chip), or a set or bank of more than one contiguous tile of memory cells. In some examples, a memory section, memory element, or a memory tile may refer to the smallest set of memory cells within the memory array 115 that may be biased in an access operation, or a smallest set of memory cells that share a common node (e.g., a common source node, a common source plate, a set of source lines that are biased to a common voltage). In some cases, a memory section may correspond to a set of memory cells associated with a same memory address. For example, the memory device 105 may receive an access command from the host system 101 including an address. Based on receiving the access command and address, the memory device 105 may access the memory section within the memory array 115 associated with the address.

The memory device 105 may include a controller 110. The controller 110 may control the operation (e.g., read operations, write operations, rewrite operations, refresh operations) of memory array 115 through the various components (e.g., a row component for activating a row of memory cells within the memory array 115, a column component for activating a column of memory cells within the memory array 115, a sense component for sensing a logic value of an accessed memory cell). The controller 110 may receive an access command from the host system 101. The access command may include an address corresponding to one or more memory cells within the memory array 115. Based on the address included within the access command, the controller 110 may generate row and column address signals to activate a target first access line (e.g., a word line) and a target second access line (e.g., a digit line). The controller 110 may also generate or control various voltages or currents used during the operation of memory device 105. Although a single controller 110 is shown, a memory device 105 may have more than one controller 110, where different controllers 110 may perform the same functions or different functions.

The memory device 105 may include a repair array 120. The repair array 120 may include an array of memory cells programmable to store different logic states. In some cases, one or more sections or elements within the memory array 115 may be faulty. The memory array 115 may be analyzed and the faulty sections of the memory array 115 may be detected. In some cases, the detection and fixing of faulty sections can be done during a manufacturing process of the memory device 105. The memory array 115 may include 128 addressable memory sections and testing may reveal that at least one of the addressable memory sections is faulty. To maintain a reliability of the memory array 115 without reducing an address space of the memory array 115 (e.g., a quantity of memory cells associated with an address and configured to store accessible data), memory sections within the repair array 120 may be used to store data associated with an address corresponding to a faulty memory section of the memory array 115. For example, if testing reveals that three memory sections within the memory array 115 are faulty (e.g., associated with faulty elements such as memory cells or access lines), data to be stored at the addresses of the three faulty memory sections may be stored within the repair array 120 (e.g., as opposed to the memory array 115). As a result, the address space associated with the memory array 115 may be maintained by combining an address space of the memory array 115 and at least a portion of the address space of the repair array 120.

The array of anti-fuses 125 may indicate whether data is stored at the memory array 115 or the repair array 120. An anti-fuse may, by default, may have an open connection. The anti-fuse may be programmed to have a closed connection based on receiving a voltage that satisfies a threshold. For example, a programming voltage or activation pulse may be applied to an anti-fuse to close a connection across the anti-fuse. The open connection may correspond to a low resistance state of the anti-fuse while the closed connection may correspond to a high resistance state of the anti-fuse. Since anti-fuses are permanently programmed, the memory within the array of anti-fuses 125 may be considered one-time programmable ROM. The array of anti-fuses 125 may include a set of blocks 130 each associated with a memory section of the repair array 120. The block 130 may either be enabled or disabled. An enabled block 130 may indicate that the element of the repair array 120 associated with the enabled block 130 is replacing a faulty memory section of the memory array 115. Additionally or alternatively, a disabled block 130 may indicate that the section of the repair array 120 associated with the block 130 is not replacing a faulty memory section of the memory array 115.

Each block 130 within the array of anti-fuses 125 may further include a set of anti-fuses to indicate an address associated with the faulty element of the memory array 115 being replaced by the repair array 120. For example, if each address includes twelve (12) bits, each block 130 may include 12 anti-fuses corresponding to each of the address bits. In some cases, an anti-fuse with an open connection may represent a logic value of '0' while an anti-fuse with a closed connection may represent a logic value of '1,' or vice versa.

During an execution of a write command, the controller 110 may receive data from the host system 101 to write to one or more memory cells associated with an address. The controller 110 may refer to the array of anti-fuses 125 to determine if the data associated with the address is to be stored in the memory array 115 or the repair array 120. The controller 110 may identify one or more blocks 130 of the array of anti-fuses 125 that are enabled and compare the address indicated by each enabled block 130. If the controller 110 determines that a block 130 is enabled and indicates a same address included in the write command, the controller 110 may determine that the section or elements associated with the address in the memory array 115 are replaced by a section or element of the repair array 120. Here, the controller 110 may write the data included within the write command to the section or elements of the repair array 120 associated with the block 130 with the same address. Alternatively, if the controller 110 determines that no enabled blocks 130 indicate a same address as included within the write command, the controller 110 may write the data included within the write command to the section or elements of the memory array 115 indicated by the address.

During an execution of a read command, the controller 110 may receive, from the host system 101, a command to read one or more memory cells associated with an address. The controller 110 may identify one or more blocks 130 of the array of anti-fuses 125 that are enabled and compare the address indicated by each enabled block 130. If the controller 110 determines that a block 130 is enabled and indicates a same address included in the read command, the controller 110 may determine that the section or elements associated with the address in the memory array 115 are being replaced by a section or element of the repair array 120. Here, the controller 110 may read data from a section or element within the repair array 120. For example, the controller 110 may determine that block 130-b is enabled and indicates a same address as the address indicated within the read command. The controller 110 may read data from a section or element within the repair array 120 that correspond to block 130-b and communicate the data to the host system 101 in response to the read command. Alternatively, if the controller 110 determines that there are no blocks 130 that are enabled and indicating a same address as included within the read command, the controller 110 may read data from a section or element within the memory array 115 and communicate the data to the host system 101 in response to the read command.

A reliability of the system 100 may be impacted by the reliability of the anti-fuses in the array of anti-fuses 125. For example, if one or more anti-fuses within the array of anti-fuses 125 is not reliably programmed, the array of anti-fuses 125 may not include valid addresses or correct enablement or disablement indicators. In some cases, unreliable anti-fuses within the array of anti-fuses 125 may cause the memory device 105 to inconsistently store or reference data within the memory array 115 and the repair array 120. For example, if block 130-a is intended to be disabled, but due to an unreliability of an anti-fuse within the array of anti-fuses 125, the block 130-a is instead enabled, the controller 110 may improperly perform access commands on a section or element within the repair array 120 when the access commands should instead be performed on a section or element within the memory array 115.

A reliability of the anti-fuses within the array of anti-fuses 125 may be increased by increasing a footprint of the anti-fuse. For example, larger anti-fuses may be more reliable than smaller anti-fuses. In another example, an anti-fuse configuration may include multiple anti-fuse outputs used in conjunction to increase the reliability of the anti-fuse configuration. In either case, increasing the reliability of an anti-fuse or anti-fuse configuration may lead to a corresponding increase in footprint of the anti-fuses. To minimize the increase in footprint of the array of anti-fuses 125, a portion of the anti-fuses within the array of anti-fuses may be configured with a higher reliability while other anti-fuses may be configured with a lower reliability. For example, anti-fuses indicating whether a block 130 is enabled may be configured with a higher reliability while anti-fuses indicating an address may be configured with a lower reliability. In some cases, an impact resulting from faulty anti-fuses configured to indicate an address may be minimized by disabling the corresponding block 130. Alternatively, an impact resulting from faulty anti-fuses configured to indicate the enablement or disablement of a block 130 may cause the memory array 115 to be unreliable and therefore discarded. By reducing the area used for the array of anti-fuses 125, more area of the memory device can be used for other functions, for example, more area may be used for the memory array 115.

Figure 2:
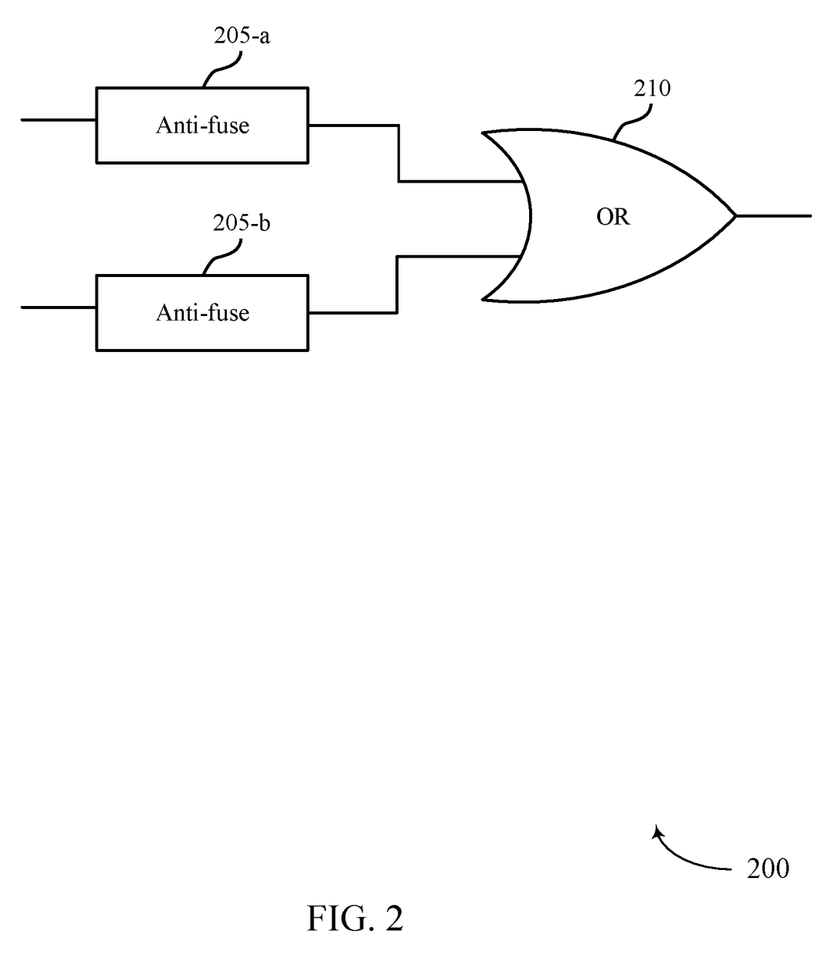
FIG. 2 illustrates an example of an anti-fuse configuration that supports apparatus and techniques for programming anti-fuses to repair a memory device in accordance with examples as disclosed herein.

FIG. 2 illustrates an anti-fuse configuration 200 that supports apparatuses and techniques for programming anti-fuses to repair a memory device in accordance with examples as disclosed herein. The anti-fuse configuration 200 may be used within the system 100 as described with reference to FIG. 1. For example, the anti-fuse configuration 200 may be used within the array of anti-fuses 125 as described with reference to FIG. 1.

The anti-fuse configuration 200 may include more than one anti-fuse 205. Each anti-fuse 205 may, by default, may have an open connection. Here, if a voltage is applied an anti-fuse 205, the output from the anti-fuse 205 may be 0 volts (e.g., indicating the open circuit). The anti-fuse 205 may be programmed to have a closed connection. For example, an activation pulse may be applied to an anti-fuse 205 to close a connection across the anti-fuse 205. Here, if a voltage is applied to the anti-fuse 205, the output from the anti-fuse 205 may be approximately equal to the voltage applied to the input of the anti-fuse 205 (e.g., indicating the closed circuit).

A reliability of an anti-fuse 205 may be based on a reliability that programming the anti-fuse 205 results in closing the circuit within the anti-fuse 205. That is, an activation pulse may be applied to an anti-fuse 205 and the anti-fuse 205 may maintain an open circuit, or an activation pulse may be applied and the anti-fuse can form a circuit having some intermediate resistance between the high resistance of an open circuit and a low resistance of a closed circuit. In some cases, the likelihood that an anti-fuse 205 maintains an open circuit after receiving a activation pulse may increase as a size of the anti-fuse 205 decreases. The anti-fuse configuration 200 may correspond to a higher reliability configuration when compared to a single anti-fuse 205. That is, if programming either anti-fuse 205-a or 205-b is successful (e.g., at closing a circuit within the anti-fuse 205), an output of the anti-fuse configuration 200 may indicate the closed circuit. Additionally or alternatively, if one of the two anti-fuses 205 is not successfully programmed, the output of the anti-fuse configuration 200 may still accurately reflect the programming.

For example, to program the anti-fuses 205-a and 205-b, a activation pulse may be applied to both anti-fuse 205-a and anti-fuse 205-b. An intended result of the activation pulse may be closing a circuit within both anti-fuse 205-a and anti-fuse 205-b. However, in some cases, applying the activation pulse to an anti-fuse 205 may not reliably close the circuit within the anti-fuse 205. That is, anti-fuse 205-a may receive the activation pulse and be programmed to have a closed connection while anti-fuse 205-b may receive the activation pulse and maintain an open connection. Here, applying a voltage to the anti-fuses 205 may result in the anti-fuse 205-a outputting a high voltage and anti-fuse 205-b outputting a voltage approximately equal to 0 volts. Both voltages are input into the OR gate 210, which may output a high voltage indicating the programmed state of at least one of the anti-fuses 205.

In some cases, a higher reliability anti-fuse configuration 200 may include more than two anti-fuses 205. For example, the anti-fuse configuration 200 may include three or more anti-fuses 205. Here, the output of each of the anti-fuses 205 may be input to an OR gate 210. As a quantity of anti-fuses 205 included in the anti-fuse configuration 200 increases, the reliability of the anti-fuse configuration 200 increases. Additionally or alternatively, a higher reliability anti-fuse configuration 200 may include larger anti-fuses 205. That is, a higher reliability anti-fuse configuration 200 may include a single larger anti-fuse 205 that has a higher reliability when compared to a single anti-fuse 205 that is smaller. In some other cases, a higher reliability anti-fuse configuration 200 may include multiple anti-fuses 205 that are each larger than a single lower reliability anti-fuse 205.

Figure 3:
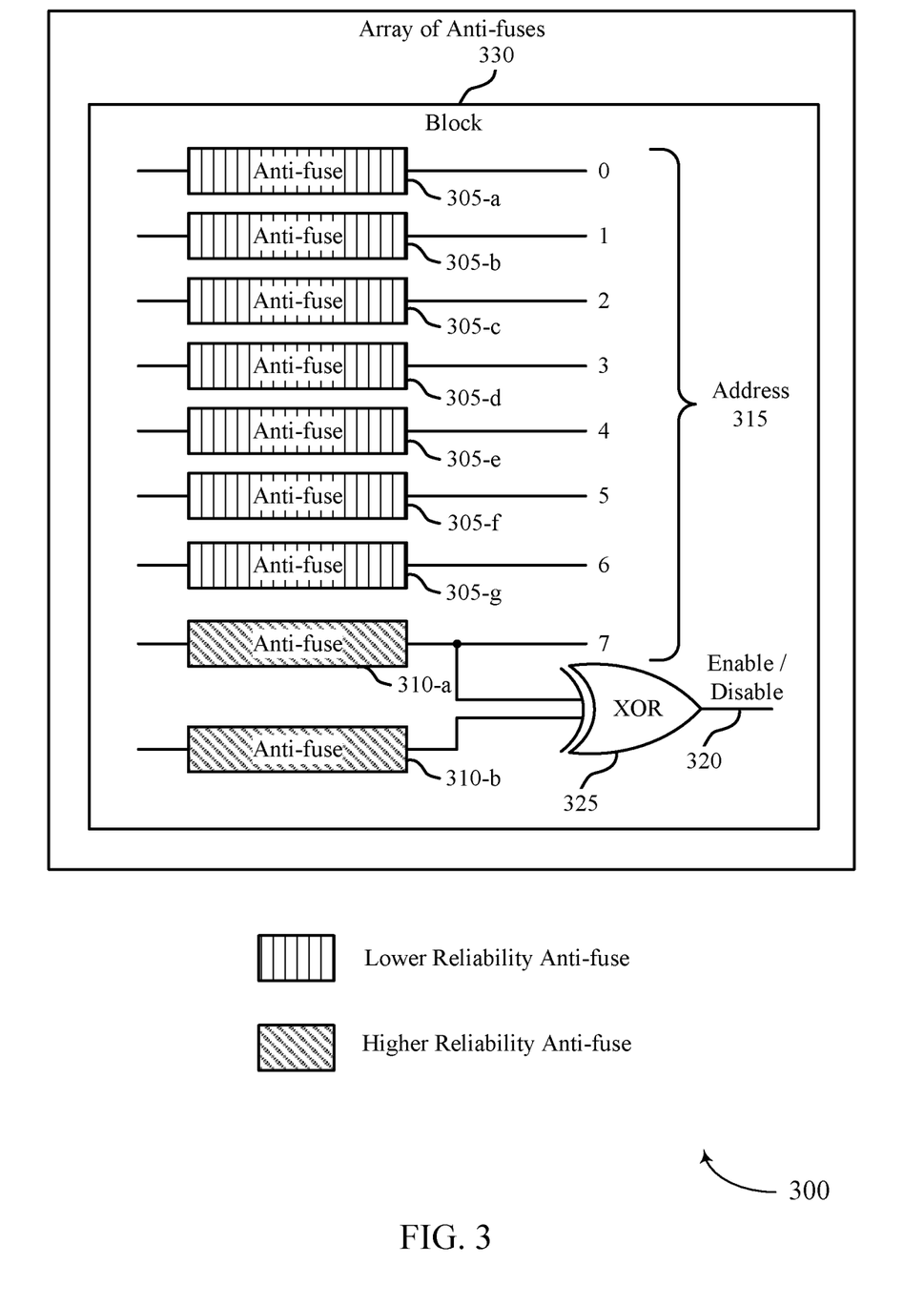
FIGS. 3 and 4 illustrate examples of arrays of anti-fuses that support apparatus and techniques for programming anti-fuses to repair a memory device in accordance with examples as disclosed herein.

FIG. 3 illustrates an array of anti-fuses 300 that supports apparatuses and techniques for programming anti-fuses to repair a memory device in accordance with examples as disclosed herein. The array of anti-fuses 300 may an example of the array of anti-fuses 125 as described with reference to FIG. 1. The array of anti-fuses 300 may include one or more components described herein with reference to FIGS. 1 and 2. For example, the array of anti-fuses 300 may include a block 330, which may be an example of a block 130 as described with reference to FIG. 1; and anti-fuses 305 and 310 which may be examples of an anti-fuse 205 or an anti-fuse configuration 200 as described with reference to FIG. 2. The array of anti-fuses 300 may further include an XOR gate 325.

The array of anti-fuses 300 may include one or more blocks 330. Each block 330 may correspond to a section or element within a repair array (e.g., a repair array 120 as described with reference to FIG. 1). Each block 330 may include a set of anti-fuses 305 and 310. The anti-fuses 305 and 310 may be configured to store an indication of an address 315. For example, a section or element within a memory array (e.g., memory array 115 as described with reference to FIG. 1) may be faulty. As a result, data associated with an address of the faulty section or element may be stored within a repair array instead. The block 330 may include an indication of the address 315 associated with data stored at the repair array. That is, if the address 315 is an eight bit address 315, the block 330 may include eight anti-fuses 305 or 310, each configured to indicate one bit of the address 315. In some other cases, the address 315 may include more or less bits (e.g., twelve bits, sixteen bits). Here, the block may include a corresponding quantity of anti-fuses 305 or 310.

Each of the anti-fuses 305 and anti-fuse 310-a may be programmed to indicate the address 315. For example, an anti-fuse 305 or 310 may be maintained in a default open state to indicate a logic value of '0' and be programmed to be in a closed state to indicate a logic value of '1.' In this manner, each of the outputs 0 through 7 from the anti-fuses 305-a, 305-b, 305-c, 305-d, 305-e, 305-f, 305-g, and 310-a may be configured to indicate the eight bit address 315.

Each block 330 may include one or more anti-fuses 310 configured to indicate an enablement or disablement of the block 330 by enable output 320. That is, the block 330 may either be enabled or disabled. An enabled block 330 may indicate that data associated with the address 315 indicated by the block 330 corresponding memory section of the repair array is replacing a faulty memory section of the memory array. Additionally or alternatively, a disabled block 330 may indicate that the corresponding section or element of the repair array 120 is not replacing a faulty section or element of the memory array. The enable output 320 may be collectively indicated by anti-fuses 310-a, 310-b, and a logic gate 325 (e.g., XOR gate 325). Here, if both of the anti-fuses 310 are open, the output of both anti-fuses 310 may be low, and the output of the XOR gate 325 (e.g., the enable output 320) may also be low. Additionally, if both of the anti-fuses 310 are closed, the output of both anti-fuses 310 may be high and the output of the XOR gate 325 (e.g., the enable output 320) may be low. Thus, block 330 may be enabled if one of the anti-fuses 310 is closed and one of the anti fuses 310 is open.

In an initial or default state, each of the anti-fuses 305 and 310 may be in an open state. Thus, the address 315 may indicate an eight bit address of a single logic state (e.g., eight logic value '0s') and both inputs to the XOR gate 325 may be low, so the enable output 320 may also be low. The low enable output 320 may correspond to a disabled block 330. When an address 315 is programmed into the anti-fuses 305 and anti-fuse 310-*a*, if anti-fuse 310-*a* is programmed to a closed state, the enable output 320 may be left high. That is, the closed state of anti-fuse 310-*a* (if the anti-fuse 310-*b* is still open), may cause the XOR gate 325 to receive one high-voltage input from the anti-fuse 310-*a* and one low-voltage input from the anti-fuse 310-*b* which may result in a high enable output 320. As a result, the block 330 may be enabled. Alternatively, if anti-fuse 310-*a* is maintained in the open state after the address 315 is programmed, the anti-fuse 310-*b* may be programmed to the closed state. Thus, the XOR gate 325 may receive one high-voltage input from the anti-fuse 310-*b* and one low-voltage input from the anti-fuse 310-*a* which may result in a high enable output 320. In some cases, the purpose of this configuration using the XOR gate is to reduce the number of anti-fuses in the block 330 (e.g., the block may not use a dedicated disable anti-fuse).

In some cases, it may be desirable to subsequently disable a block 330 after programming an address 315 into the anti-fuses 305 and the anti-fuse 310-*a*. For example, the address 315 may be different from an intended address. In order to disable the block 330, one of the anti-fuses 310 may be programmed to be closed. That is, to enable the block 330, a one of the anti-fuses 310 may be programmed to be closed and one of the anti-fuses 310 may be maintained in an open state. To disable the block 330, the anti-fuse 310 maintained in the open state may be programmed to be closed. Thus, the XOR gate 325 may receive two high voltage inputs and consequently output a low enable output 320 indicating a disabled block 330.

The anti-fuses 310 used for disabling the block 330 may be in a higher reliability configuration than other anti-fuses in the block 330 (e.g., anti-fuses 305). To ensure the correct operation of the memory device, the memory device should be able to reliably disable a block 330. The anti-fuses are one-time programmable devices that are read-only. Thus, when a block 330 is programmed there is a limited ability to reprogram the block 330. If an error occurs in one of the anti-fuses associated with the address 315 or an anti-fuse associated with the enable signal, a way to address the error is to disable the entire block 330 and write the address to a new block. Meaning, if an error occurs in a block, that block is discarded permanently. However, if an error occurs with the disable signal, the block 330 may remain enabled and my introduce errors into access operations. Thus, anti-fuses associated with disabling blocks 330 may be in a higher reliability configuration than other anti-fuses to ensure that the block 330 can be disabled. The array of anti-fuses 300 may include anti-fuses having different configurations in a way to save area occupied by the anti-fuses because higher reliability anti-fuses can use more area than lower reliability anti-fuses.

When a memory device receives an access command including an address, a controller of the memory device may compare the address from the access command to addresses indicated within enabled blocks 330 of the array of anti-fuses 300. For example, the controller may apply a voltage to each of the anti-fuses 310 and monitor the enable output 320 to determine whether the enable output 320 indicates a high voltage (e.g., that the block 330 is enabled) or a low voltage (e.g., that the block 330 is disabled or not enabled). If the controller determines that the block 330 is enabled, the controller may apply a voltage to each of the anti-fuses 305 and 310 configured to indicate the address 315. The controller may compare each of the output bits (bit '0' through bit '7') to the address included within the access command. If the controller determines that the address 315 is the same as the address within the access command, the controller may access a section or element within the repair array associated with the block 330. Alternatively, if the controller determines that no address 315 indicated by a block 330 within the array of anti-fuses 300 is the same as the address included within the access command, the controller may access a section or element within the memory array.

Anti-fuse 310-*a* may be configured to indicate a last bit of the address 315 (e.g., bit 7 of the address 315) and indicate, in conjunction with anti-fuse 310-*b* and XOR gate 325) the enable output 320. That is, the block 330 may include anti-fuses 305 and 310-*a* configured to indicate the address 315 and one additional anti-fuse 310-*b*. This configuration may decrease a quantity of anti-fuses 305 and 310 within the block 330 when compared to a configuration where each anti-fuse 305 or 310 within the block 330 is configured to indicate either the address 315 or the enable output 320.

In some cases, the anti-fuses 305 may be a different configuration than the anti-fuses 310. For example, the anti-fuses 310 may be a higher reliability configuration than the anti-fuses 305. In some cases, anti-fuses 310 may be larger than an anti-fuses 305, thus increasing the reliability of anti-fuses 310 in comparison to anti-fuses 305. In some other cases (e.g., as described with reference to FIG. 2), anti-fuses 310-*a* and 310-*b* may each include more than one anti-fuse and a logic component (e.g., an OR gate). The higher reliability configurations of the anti-fuses 310 may increase the reliability of enable output 320.

Figure 4:
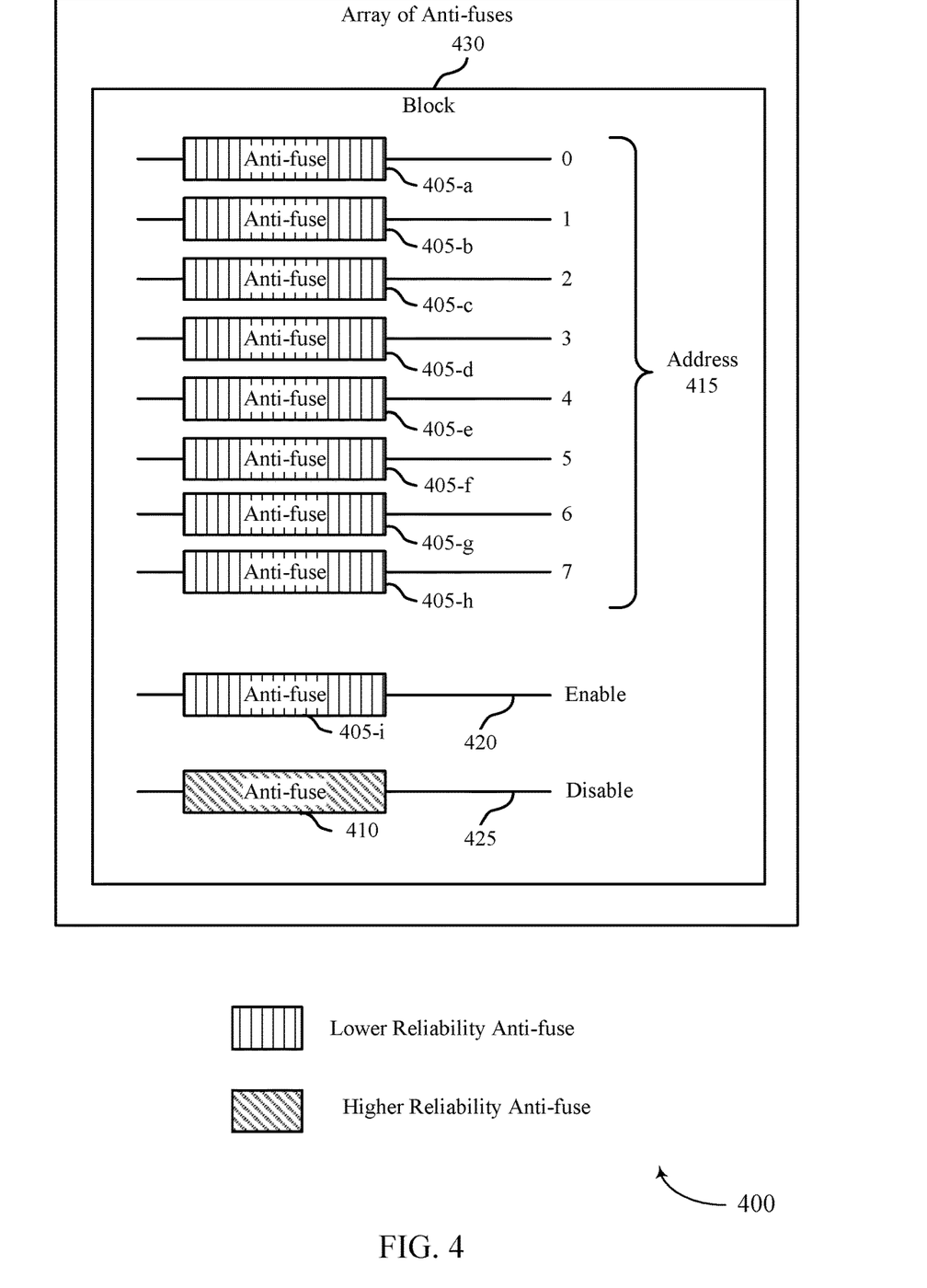

FIG. 4 illustrates an array of anti-fuses 400 that supports apparatuses and techniques for programming anti-fuses to repair a memory device in accordance with examples as disclosed herein. The array of anti-fuses 400 may an example of the array of anti-fuses 125 as described with reference to FIG. 1. The array of anti-fuses 400 may include one or more components described herein with reference to FIGS. 1 and 2. For example, the array of anti-fuses 400 may include a block 430, which may be an example of a block 130 as described with reference to FIG. 1; and anti-fuses 405 and 410 which may be examples of an anti-fuse 205 or an anti-fuse configuration 200 as described with reference to FIG. 2.

The array of anti-fuses 400 may include one or more blocks 430. Each block 430 may correspond to a section or element within a repair array (e.g., a repair array 120 as described with reference to FIG. 1). Each block 430 may include a set of anti-fuses 405 and 410. The anti-fuses 405 may be configured to store an indication of an address 415. For example, a section or element within a memory array (e.g., memory array 115 as described with reference to FIG. 1) may be faulty. As a result, data associated with an address of the faulty section or elements may be stored within a repair array instead. The block 430 may include an indication of the address 415 associated with data stored at the repair array. That is, if the address 415 is an eight bit address 415, the block 430 may include eight anti-fuses 405, each configured to indicate one bit of the address 415. In some other cases, the address 415 may include more or less bits (e.g., twelve bits, sixteen bits). Here, the block may include a corresponding quantity of anti-fuses 405.

Each of the anti-fuses 405 may be programmed to indicate the address 415. For example, an anti-fuse 405 may be maintained in a default open state to indicate a logic value of '0' and be programmed to be in a closed state to indicate a logic value of '1.' In this manner, each of the outputs 0 through 7 from the anti-fuses 405-*a*, 405-*b*, 405-*c*, 405-*d*, 405-*e*, 405-*f*, 405-*g*, and 405-*h* may be configured to indicate the eight bit address 415.

Each block 430 may include one or more anti-fuses 405-*i* and 410 configured to indicate an enablement or disablement of the block 430 by an enable signal 420 or a disable signal 435. That is, the block 430 may either be enabled or disabled. An enabled block 430 may indicate that data associated with the address indicated by the block 430 corresponding memory section of the repair array 120 is replacing a faulty memory section of the memory array. Additionally or alternatively, a disabled block 430 may indicate that the corresponding memory section of the repair array is not replacing a faulty memory section of the memory array. The memory block 430 may include anti fuses 405-*i* and 410 configured to collectively indicate an enable signal 420 and a disable signal 425. Here, the enable signal 420 may indicate that the block 430 is enabled if the anti-fuse 405-*i* is closed and the disable signal 425 may indicate that the block 430 is disabled if the anti-fuse 410 is closed.

In an initial or default state, each of the anti-fuses 405-*i* and 410 may be in an open state. Thus, the enable signal 420 and the disable signal 425 may both output a low voltage indicating that the block 430 is disabled. To enable the block 430, the anti-fuse 405-*i* may be programmed (e.g., resulting in a closed circuit). To determine whether a block 430 is enabled, the controller of the memory device may check the output of the enable signal 420. To disable the block 430, the anti-fuse 410 (in a higher reliability configuration) may be programmed (e.g., resulting in a closed circuit). To determine whether a block 430 is disabled, the controller of the memory device may check the output of the disable signal 425. The determined output of the disable signal 425 may override any output of the enable signal 420. Alternatively, an XOR gate may be used with anti-fuse 405-*i* and the anti-fuse 410. In such an implementation, to enable the block 430, the anti-fuse 405-*i* may be programmed (e.g., closed). Here, the anti-fuse 405-*i* may output a high voltage and anti-fuse 410 may output a low voltage and the output of the XOR gate may be high. In some cases, it may be desirable to subsequently disable the block 430. For example, the address 415 may be different from an intended address. In order to disable the block 430, the anti-fuse 410 may be programmed (e.g., closed). Thus, the XOR gate may receive two high voltage inputs and consequently output a low output indicating a disabled block 430. If an XOR gate is used the anti-fuse 405-*i* may be in a higher reliability configuration.

When a memory device receives an access command including an address, a controller of the memory device may compare the address from the access command to addresses indicated within enabled blocks 430 of the array of anti-fuses 400. For example, the controller may apply a voltage to the anti-fuse 410 and monitor the disable signal 425 to determine whether the disable signal 425 indicates a high voltage (e.g., that the block 430 is enabled) or a low voltage (e.g., that the block 430 is disabled or not enabled). If the controller determines that the block 430 is enabled, the controller may apply a voltage to each of the anti-fuses 405 and 410 configured to indicate the address 415. The controller may compare each of the output bits (bit '0' through bit '7') to the address included within the access command. If the controller determines that the address 415 is the same as the address within the access command, the controller may access a section or element within the repair array associated with the block 430. Alternatively, if the controller determines that no address 415 indicated by a block 430 within the array of anti-fuses 400 is the same as the address included within the access command, the controller may access a section or element within the memory array.

In some cases, the anti-fuses 405 may be a different configuration than the anti-fuse 410. For example, the anti-fuse 410 may be a higher reliability configuration than the anti-fuses 405. In some cases, anti-fuse 410 may be larger than an anti-fuses 405, thus increasing the reliability of anti-fuse 410 in comparison to anti-fuses 405. In some other cases (e.g., as described with reference to FIG. 2), the anti-fuse 410 may each include more than one anti-fuse and a logic component (e.g., an OR gate). The higher reliability configurations of the anti-fuse 410 may increase the reliability of disable signal 425. The increased reliability of the anti-fuse 410 configured to output the disable signal 425 may allow for the block 430 to be disabled with a high reliability. This may preserve a reliability of the memory device including the array of anti-fuses 400.

Figure 5:
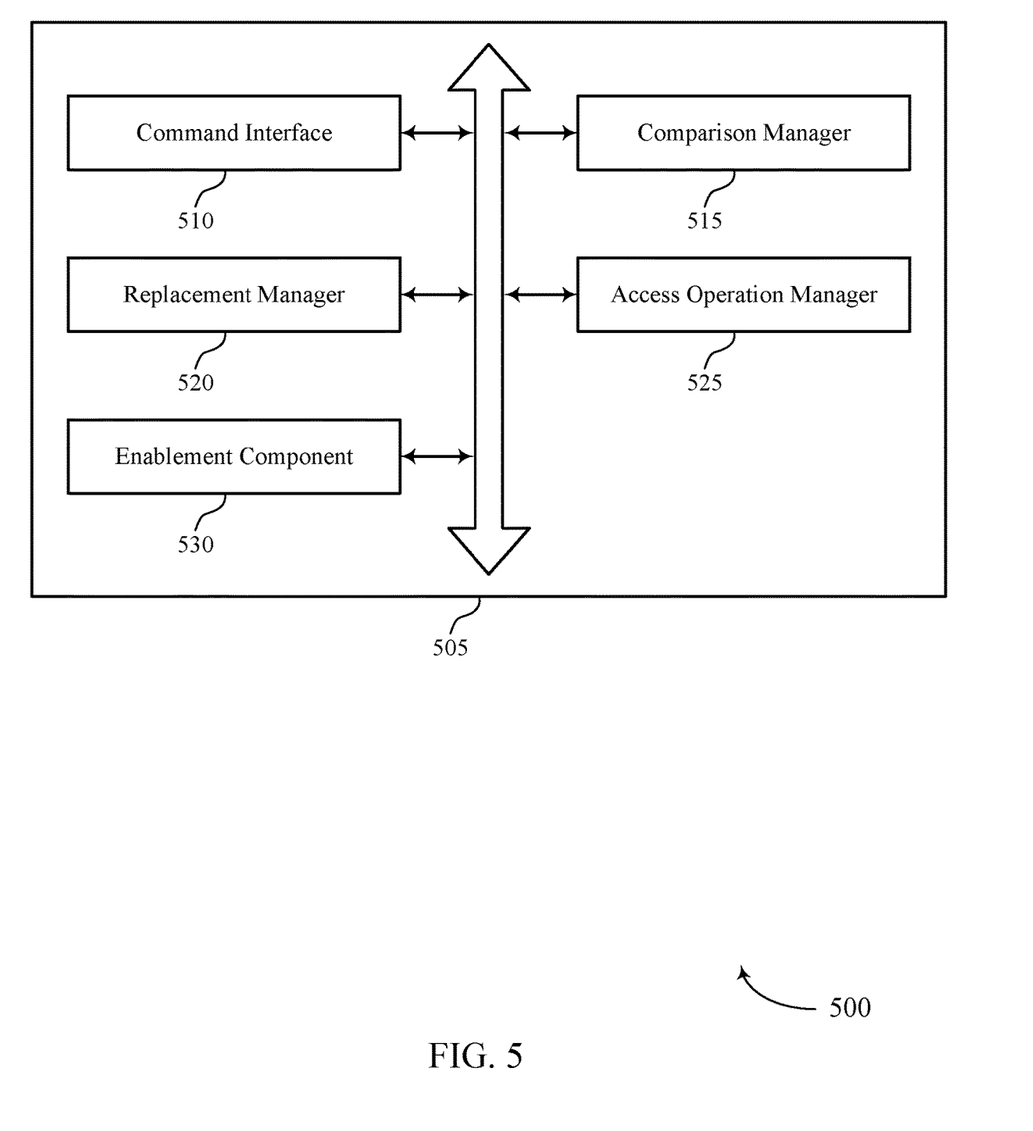
FIG. 5 shows a block diagram of a memory device that supports apparatus and techniques for programming anti-fuses to repair a memory device in accordance with examples as disclosed herein.

FIG. 5 shows a block diagram 500 of a memory device 505 that supports apparatus and techniques for programming anti-fuses to repair a memory device in accordance with examples as disclosed herein. The memory device 505 may be an example of aspects of a memory device as described with reference to FIGS. 1 through 4. The memory device 505 may include a command interface 510, a comparison manager 515, a replacement manager 520, an access operation manager 525, and an enablement component 530. Each of these modules may communicate, directly or indirectly, with one another (e.g., via one or more buses).

The command interface 510 may receive, from a host system, a command to perform an access operation using a memory device, the command including an address.

The comparison manager 515 may compare the address of the command with addresses stored in an array of anti-fuses including a set of blocks to indicate whether a first element of a repair array is used in place of a second element of a memory array, each block of the array of anti-fuses including a first set of anti-fuses having a lower reliability configuration, and a second set of anti-fuses having a higher reliability configuration operable to provide a higher reliability than the lower reliability configuration. In some examples, the comparison manager 515 may identify a second address of the second element of the memory array being replaced by the first element of the repair array using the first anti-fuse in the higher reliability configuration and a set of other anti-fuses in the lower reliability configuration, where comparing the address of the command with the address stored in the array of anti-fuses is based on identifying the second address.

The replacement manager 520 may determine that an element indicated by the address of the command is replaced by the first element of the repair array based on the comparison.

The access operation manager 525 may perform the access operation on the first element of the repair array based on determining that the element indicated by the address of the command is replaced by the first element of the repair array.

The enablement component 530 may determine that one, and only one, of a first anti-fuse in the higher reliability configuration and a second anti-fuse in the higher reliability configuration are activated, where comparing the address of the command with the address stored in the array of anti-fuses is based on the determination. In some cases, the first anti-fuse is for indicating a portion of a second address of the second element of the memory array that is being replaced.

Additionally or alternatively, the second anti-fuse is for indicating whether the first element of the repair array is enabled.

Figure 6:
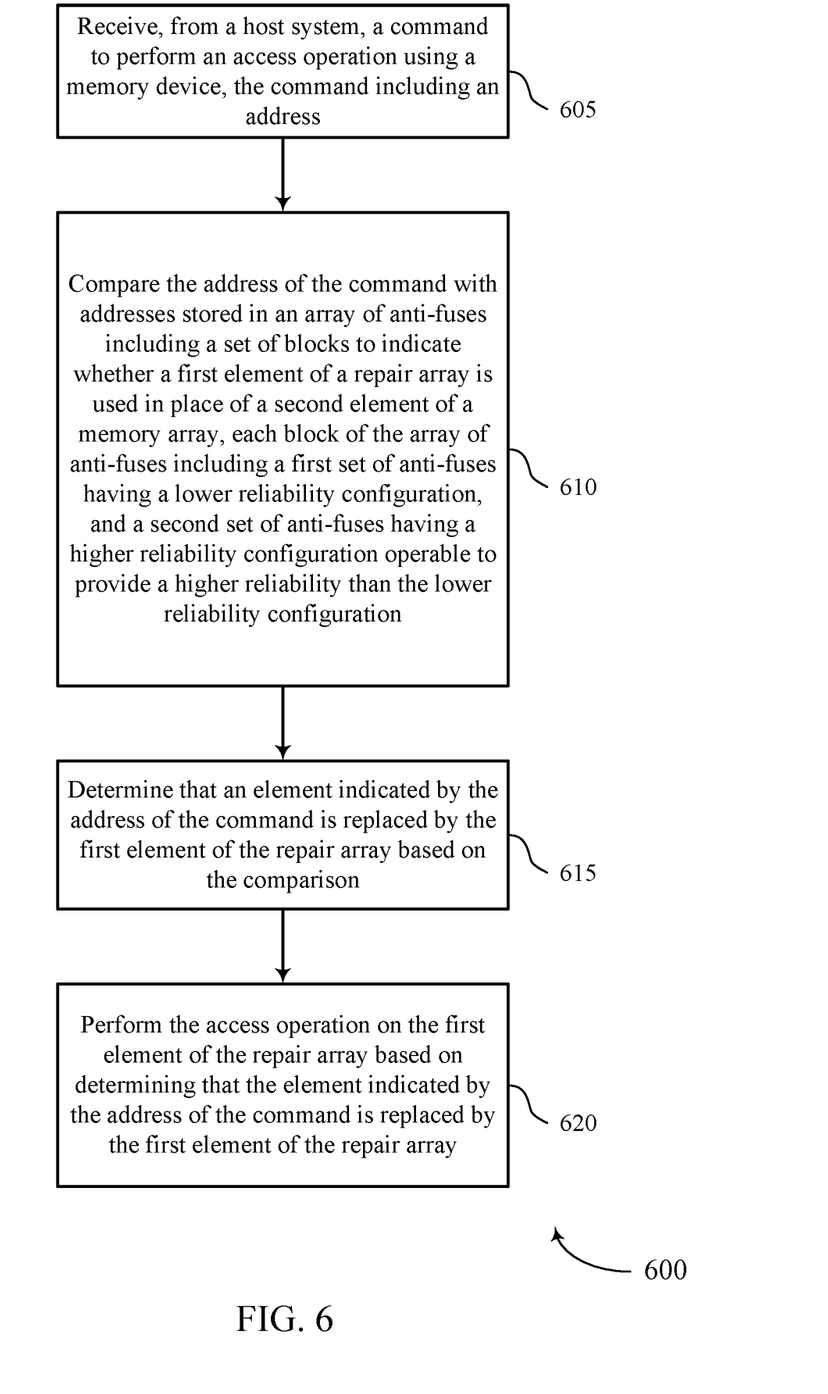
FIG. 6 shows a flowchart illustrating a method or methods that support apparatus and techniques for programming anti-fuses to repair a memory device in accordance with examples as disclosed herein.

FIG. 6 shows a flowchart illustrating a method or methods 600 that supports apparatus and techniques for programming anti-fuses to repair a memory device in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may receive, from a host system, a command to perform an access operation using a memory device, the command including an address. The operations of 605 may be performed according to the methods described herein. In some examples, aspects of the operations of 605 may be performed by a command interface as described with reference to FIG. 5.

At 610, the memory device may compare the address of the command with addresses stored in an array of anti-fuses including a set of blocks to indicate whether a first element of a repair array is used in place of a second element of a memory array, each block of the array of anti-fuses including a first set of anti-fuses having a lower reliability configuration, and a second set of anti-fuses having a higher reliability configuration operable to provide a higher reliability than the lower reliability configuration. The operations of 610 may be performed according to the methods described herein. In some examples, aspects of the operations of 610 may be performed by a comparison manager as described with reference to FIG. 5.

At 615, the memory device may determine that an element indicated by the address of the command is replaced by the first element of the repair array based on the comparison. The operations of 615 may be performed according to the methods described herein. In some examples, aspects of the operations of 615 may be performed by a replacement manager as described with reference to FIG. 5.

At 620, the memory device may perform the access operation on the first element of the repair array based on determining that the element indicated by the address of the command is replaced by the first element of the repair array. The operations of 620 may be performed according to the methods described herein. In some examples, aspects of the operations of 620 may be performed by an access operation manager as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving, from a host system, a command to perform an access operation using a memory device, the command including an address. The apparatus may further include features, means, or instructions for comparing the address of the command with addresses stored in an array of anti-fuses including a set of blocks to indicate whether a first element of a repair array is used in place of a second element of a memory array, each block of the array of anti-fuses including a first set of anti-fuses having a lower reliability configuration, and a second set of anti-fuses having a higher reliability configuration operable to provide a higher reliability than the lower reliability configuration. The apparatus may further include features, means, or instructions for determining that an element indicated by the address of the command is replaced by the first element of the repair array based on the comparison, and performing the access operation on the first element of the repair array based on determining that the element indicated by the address of the command is replaced by the first element of the repair array.

Some examples of the method 600 and the apparatus described herein may further include operations, features, means, or instructions for determining that one, and only one, of a first anti-fuse in the higher reliability configuration and a second anti-fuse in the higher reliability configuration may be activated, where comparing the address of the command with the address stored in the array of anti-fuses may be based on the determination.

In some examples of the method 600 and the apparatus described herein, the first anti-fuse may be for indicating a portion of a second address of the second element of the memory array that may be being replaced, and the second anti-fuse may be for indicating whether the first element of the repair array may be enabled.

Some examples of the method 600 and the apparatus described herein may further include operations, features, means, or instructions for identifying a second address of the second element of the memory array being replaced by the first element of the repair array using the first anti-fuse in the higher reliability configuration and a set of other anti-fuses in the lower reliability configuration, where comparing the address of the command with the address stored in the array of anti-fuses may be based on identifying the second address.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array for storing data associated with a host system, a repair array including elements for replacing faulty elements of the memory array, and an array of anti-fuses including a set of blocks to indicate whether a first element of the repair array replaces a second element of the memory array. Each block of the array of anti-fuses may include a first set of anti-fuses having a lower reliability, each anti-fuse of the first set of anti-fuses being in a first configuration and a second set of anti-fuses having a higher reliability, each anti-fuse of the second set of anti-fuses being in a second configuration operable to provide a higher reliability than the first configuration.

In some examples, the array of anti-fuses further may include a third set of anti-fuses for indicating an address of the second element of the memory array being replaced by the first element of the repair array, at least one anti-fuse of the third set being in the first configuration and at least one anti-fuse of the third set being in the second configuration, and a fourth set of anti-fuses for indicating whether the first element of the repair array may be enabled, at least one anti-fuse of the fourth set being in the second configuration.

Some cases of the apparatus may include a logic component coupled with a first anti-fuse of the third set and a second anti-fuse of the fourth set, the logic component to output a signal if one, and only one, of the first anti-fuse or the second anti-fuse may be activated. In some instances, the logic component includes an XOR gate. Some examples of the apparatus may include a controller to determine the first element of the repair array may be enabled based on the output of the logic component.

In some cases, the array of anti-fuses further may include a third set of anti-fuses for indicating an address of the second element of the memory array being replaced by the first element of the repair array, each anti-fuse of the third set being in the first configuration, and a fourth set of anti-fuses for indicating whether the first element of the repair array may be enabled, the fourth set of anti-fuses including a first anti-fuse for enabling the first element in the first configuration and a second anti-fuse for disabling the first element in the second configuration.

In some examples, an anti-fuse in the second configuration may include two or more anti-fuses in a parallel configuration, and a logic component to output a signal if any of the two or more anti-fuses may be activated. In some instances, the logic component includes an OR gate.

In some cases, an anti-fuse in the first configuration includes a single anti-fuse. In some examples, the anti-fuse in the second configuration includes a single anti-fuse having a higher likelihood of being activated after receiving an activation pulse than a single anti-fuse of the first configuration. In some instances, the higher reliability of the anti-fuse in the second configuration includes a higher likelihood that the anti-fuse transitions from a high resistance state to a low resistance state that creates an electrically conductive path after receiving an activation pulse.

Some examples of the apparatus may include a component to compare an address received from the host system for an access operation with addresses stored in the array of anti-fuses, where determining whether to use the first element of the repair array or the second element of the memory array for the access operation may be based on comparing the address for the access operation with the addresses stored in the array of anti-fuses.

An apparatus is described. The apparatus may include a memory array for storing data associated with a host system, a repair array including elements for replacing faulty elements of the memory array, and an array of anti-fuses including a set of blocks operable to indicate whether a first element of the repair array replaces a second element of the memory array. Each block of the array of anti-fuses may include a first set of anti-fuses for indicating an address of the second element of the memory array being replaced by the first element of the repair array, a set of anti-fuses of the first set being in a lower reliability configuration and a first anti-fuse of the first set being in a higher reliability configuration operable to provide a higher reliability than the lower reliability configuration and a second set of anti-fuses for indicating whether the first element of the repair array is enabled, the second set including a second anti-fuse in the higher reliability configuration.

Some examples of the apparatus may include a logic component coupled with the first anti-fuse of the first set and the second anti-fuse of the second set and operable to output a signal if one, and only one, of the first anti-fuse or the second anti-fuse may be activated.

In some cases, the first element of the repair array may be enabled to replace the second element of the repair array when the logic component may be outputting the signal. In some instances, an anti-fuse in the higher reliability configuration includes two or more anti-fuses in a parallel configuration and a second logic component to output a second signal if any of the two or more anti-fuses are activated. An anti-fuse in the lower reliability configuration may include a single anti-fuse.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array for storing data associated with a host system;
   a repair array comprising elements for replacing faulty elements of the memory array; and
   an array of anti-fuses comprising a plurality of blocks to indicate whether a first element of the repair array replaces a second element of the memory array, each block of the array of anti-fuses comprising:
      a first set of anti-fuses having a lower reliability, each anti-fuse of the first set of anti-fuses being in a first configuration;
      a second set of anti-fuses having a higher reliability, each anti-fuse of the second set of anti-fuses being in a second configuration operable to provide a higher reliability than the first configuration;
      a third set of anti-fuses for indicating an address of the second element of the memory array being replaced by the first element of the repair array, each anti-fuse of the third set being in the first configuration; and
      a fourth set of anti-fuses for indicating whether the first element of the repair array is enabled, the fourth set of anti-fuses comprising a first anti-fuse for enabling the first element in the first configuration and a second anti-fuse for disabling the first element in the second configuration.

2. An apparatus comprising:
   a memory array for storing data associated with a host system;
   a repair array comprising elements for replacing faulty elements of the memory array; and
   an array of anti-fuses comprising a plurality of blocks to indicate whether a first element of the repair array replaces a second element of the memory array, each block of the array of anti-fuses comprising:
      a first set of anti-fuses having a lower reliability, each anti-fuse of the first set of anti-fuses being in a first configuration;
      a second set of anti-fuses having a higher reliability, each anti-fuse of the second set of anti-fuses being in a second configuration operable to provide a higher reliability than the first configuration;
      a third set of anti-fuses for indicating an address of the second element of the memory array being replaced by the first element of the repair array, at least one anti-fuse of the third set being in the first configuration and at least one anti-fuse of the third set being in the second configuration; and
      a fourth set of anti-fuses for indicating whether the first element of the repair array is enabled, at least one anti-fuse of the fourth set being in the second configuration.

3. The apparatus of claim 2, further comprising:
   a logic component coupled with a first anti-fuse of the third set and a second anti-fuse of the fourth set, the logic component to output a signal if one, and only one, of the first anti-fuse or the second anti-fuse is activated.

4. The apparatus of claim 3, wherein the logic component comprises an XOR gate.

5. The apparatus of claim 3, further comprising:
   a controller to determine the first element of the repair array is enabled based at least in part on the output of the logic component.

6. The apparatus of claim 1, wherein an anti-fuse in the second configuration comprises:
   two or more anti-fuses in a parallel configuration; and
   a logic component to output a signal if any of the two or more anti-fuses are activated.

7. The apparatus of claim 6, wherein the logic component comprises an OR gate.

8. The apparatus of claim 1, wherein an anti-fuse in the first configuration comprises a single anti-fuse.

9. The apparatus of claim 1, wherein the anti-fuse in the second configuration comprises a single anti-fuse having a higher likelihood of being activated after receiving an activation pulse than a single anti-fuse in the first configuration.

10. The apparatus of claim 1, wherein the higher reliability of an anti-fuse in the second configuration comprises a higher likelihood that the anti-fuse transitions from a high resistance state to a low resistance state that creates an electrically conductive path after receiving an activation pulse.

11. The apparatus of claim 1, further comprising:
a component to compare an address received from the host system for an access operation with addresses stored in the array of anti-fuses, wherein determining whether to use the first element of the repair array or the second element of the memory array for the access operation is based at least in part on comparing the address for the access operation with the addresses stored in the array of anti-fuses.

12. A method, comprising:
receiving, from a host system, a command to perform an access operation using a memory device, the command comprising an address;
determining that one, and only one, of a first anti-fuse in a higher reliability configuration and a second anti-fuse in the higher reliability configuration are activated,
comparing the address of the command with addresses stored in an array of anti-fuses comprising a plurality of blocks to indicate whether a first element of a repair array is used in place of a second element of a memory array, each block of the array of anti-fuses comprising a first set of anti-fuses having a lower reliability configuration, and a second set of anti-fuses having the higher reliability configuration operable to provide a higher reliability than the lower reliability configuration, wherein comparing the address of the command with the address stored in the array of anti-fuses is based at least in part on the determination and wherein the first anti-fuse is for indicating a portion of a second address of the second element of the memory array that is being replaced and the second anti-fuse is for indication whether the first element of the repair array is enabled;
determining that an element indicated by the address of the command is replaced by the first element of the repair array based at least in part on the comparison; and
performing the access operation on the first element of the repair array based at least in part on determining that the element indicated by the address of the command is replaced by the first element of the repair array.

13. A method comprising:
receiving, from a host system, a command to perform an access operation using a memory device, the command comprising an address;
determining that one, and only one, of a first anti-fuse in a higher reliability configuration and a second anti-fuse in the higher reliability configuration are activated;
comparing the address of the command with addresses stored in an array of anti-fuses comprising a plurality of blocks to indicate whether a first element of a repair array is used in place of a second element of a memory array, each block of the array of anti-fuses comprising a first set of anti-fuses having a lower reliability configuration, and a second set of anti-fuses having the higher reliability configuration operable to provide a higher reliability than the lower reliability configuration, wherein comparing the address of the command with the address stored in the array of anti-fuses is based at least in part on the determination and wherein the first anti-fuse is for indicating a portion of a second address of the second element of the memory array that is being replaced and the second anti-fuse is for indication whether the first element of the repair array is enabled;
determining that an element indicated by the address of the command is replaced by the first element of the repair array based at least in part on the comparison;
performing the access operation on the first element of the repair array based at least in part on determining that the element indicated by the address of the command is replaced by the first element of the repair array; and
identifying the second address of the second element of the memory array being replaced by the first element of the repair array using the first anti-fuse in the higher reliability configuration and a plurality of other anti-fuses in the lower reliability configuration, wherein comparing the address of the command with the address stored in the array of anti-fuses is based at least in part on identifying the second address.

14. An apparatus, comprising:
a memory array for storing data associated with a host system;
a repair array comprising elements for replacing faulty elements of the memory array; and
an array of anti-fuses comprising a plurality of blocks operable to indicate whether a first element of the repair array replaces a second element of the memory array, each block of the array of anti-fuses comprising:
a first set of anti-fuses for indicating an address of the second element of the memory array being replaced by the first element of the repair array, a plurality of anti-fuses of the first set being in a lower reliability configuration and a first anti-fuse of the first set being in a higher reliability configuration operable to provide a higher reliability than the lower reliability configuration; and
a second set of anti-fuses for indicating whether the first element of the repair array is enabled, the second set comprising a second anti-fuse in the higher reliability configuration.

15. The apparatus of claim 14, further comprising:
a logic component coupled with the first anti-fuse of the first set and the second anti-fuse of the second set and operable to output a signal if one, and only one, of the first anti-fuse or the second anti-fuse is activated.

16. The apparatus of claim 15, wherein the first element of the repair array is enabled to replace the second element of the repair array when the logic component is outputting the signal.

17. The apparatus of claim 15, wherein:
an anti-fuse in the higher reliability configuration comprises:
two or more anti-fuses in a parallel configuration;
a second logic component to output a second signal if any of the two or more anti-fuses are activated; and
an anti-fuse in the lower reliability configuration comprises a single anti-fuse.

* * * * *